(12) United States Patent
Halloran et al.

(10) Patent No.: US 8,714,342 B2
(45) Date of Patent: May 6, 2014

(54) SYSTEM AND METHOD FOR GAPPING CONVEYED SUBSTRATES

(75) Inventors: Sean Timothy Halloran, Denver, CO (US); James Victor Schaefer, Ann Arbor, MI (US); Frank Sanford Prescott, Berthoud, CO (US)

(73) Assignee: First Solar, Inc., Tempe, AZ (US)

( * ) Notice: Subject to any disclaimer, the term of this patent is extended or adjusted under 35 U.S.C. 154(b) by 139 days.

(21) Appl. No.: 13/434,911

(22) Filed: Mar. 30, 2012

(65) Prior Publication Data

US 2013/0259610 A1  Oct. 3, 2013

(51) Int. Cl.
*B65G 43/00* (2006.01)
(52) U.S. Cl.
USPC .................................. 198/460.1; 198/461.1
(58) Field of Classification Search
USPC ........... 198/460.1, 461.1, 461.2, 461.3, 462.1
See application file for complete search history.

(56) References Cited

U.S. PATENT DOCUMENTS

| | | | | | |
|---|---|---|---|---|---|
| 4,369,876 | A | * | 1/1983 | Small et al. | 198/460.3 |
| 5,341,916 | A | * | 8/1994 | Doane et al. | 198/460.1 |
| 5,370,162 | A | * | 12/1994 | Lewis | 198/461.2 |
| 6,629,593 | B2 | * | 10/2003 | Zeitler | 198/460.1 |
| 8,196,737 | B2 | * | 6/2012 | Brayman et al. | 198/832 |

* cited by examiner

*Primary Examiner* — James R Bidwell
(74) *Attorney, Agent, or Firm* — MacMillan, Sobanski & Todd, LLC

(57) ABSTRACT

A method for gapping substrates conveyed through a vacuum chamber is disclosed. The method may include positioning an upstream substrate outside the vacuum chamber as a downstream substrate is conveyed within the vacuum chamber, detecting a position of the downstream substrate within the vacuum chamber and conveying the upstream substrate into the vacuum chamber at a conveyance rate greater than a conveyance rate of the downstream substrate to set a gap between the downstream substrate and the upstream substrate.

16 Claims, 7 Drawing Sheets

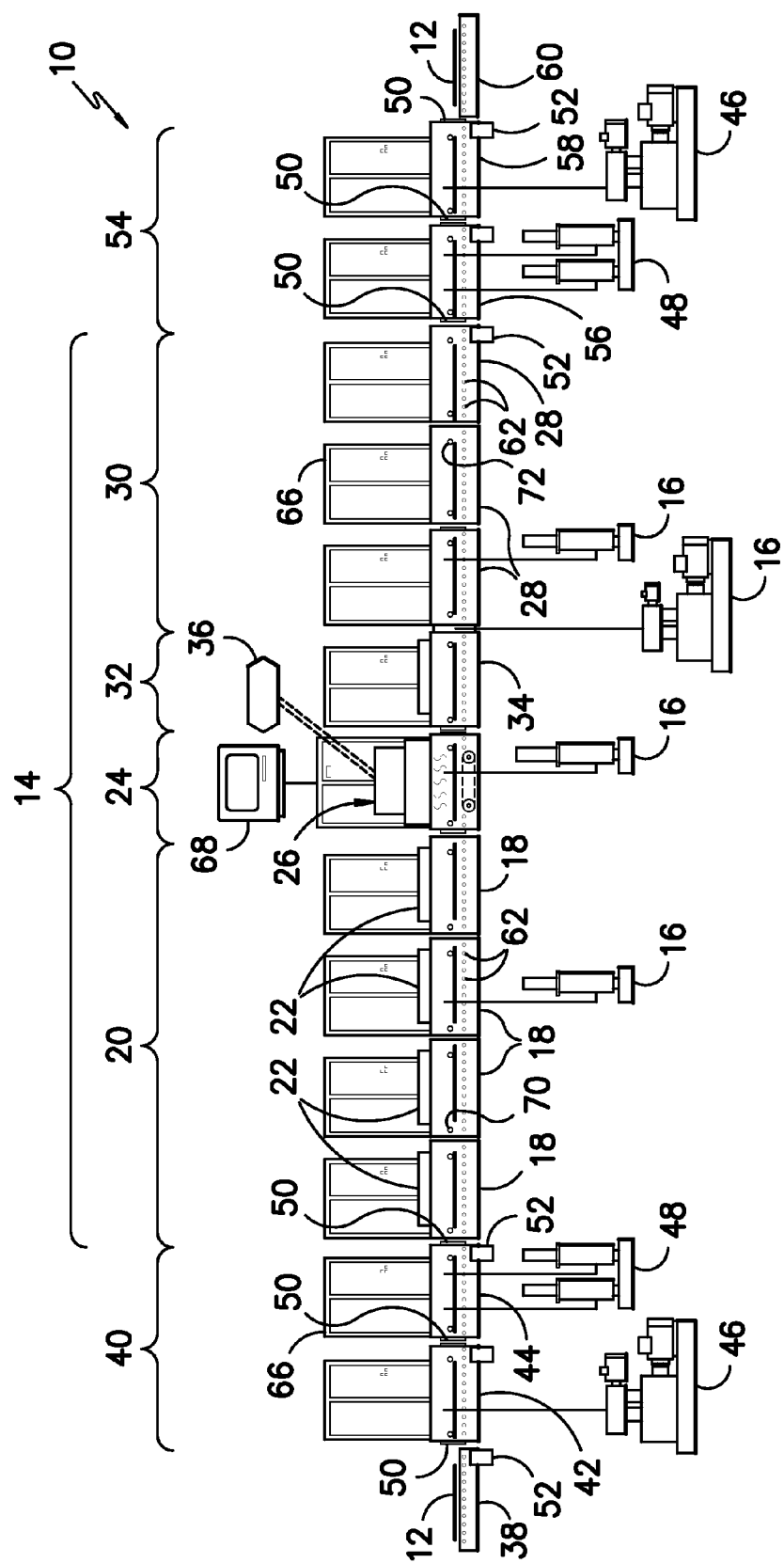
FIG. -1-

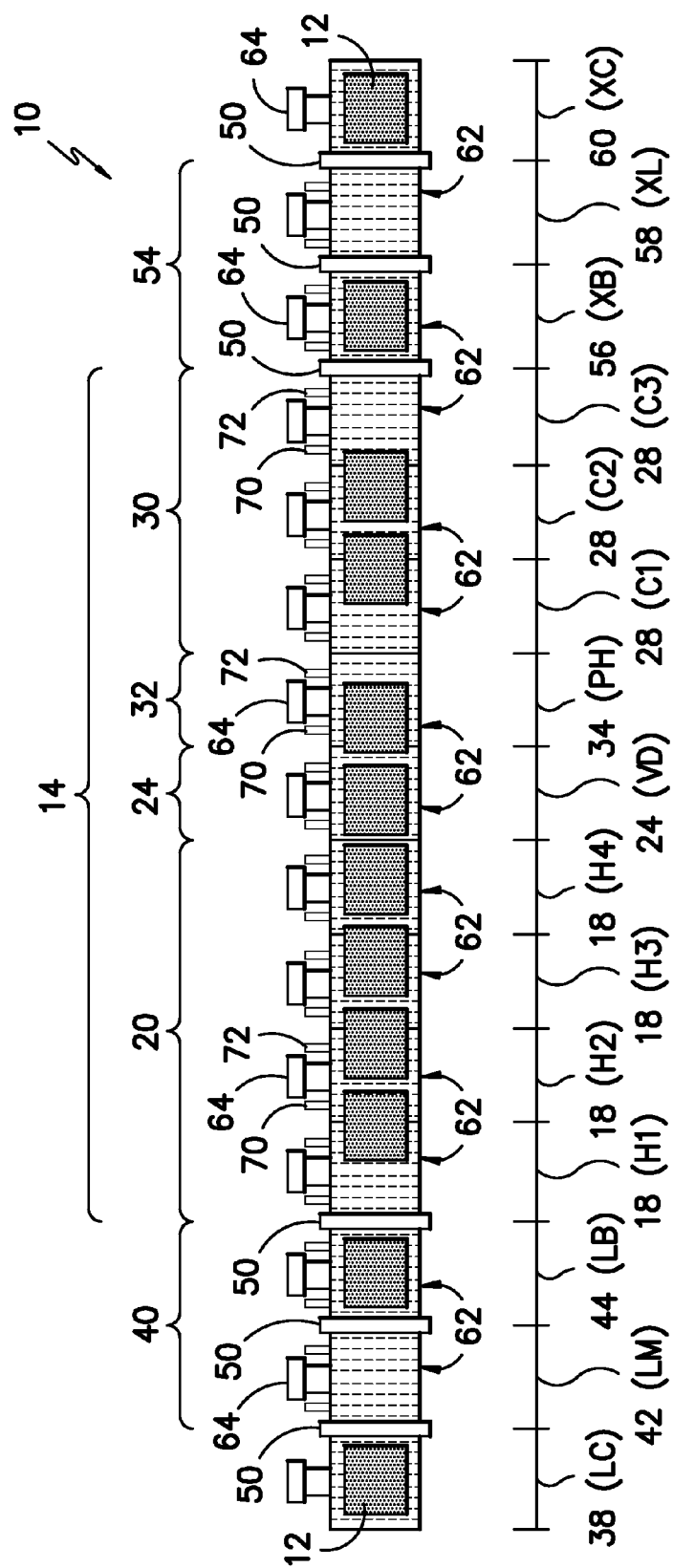
FIG. -2-

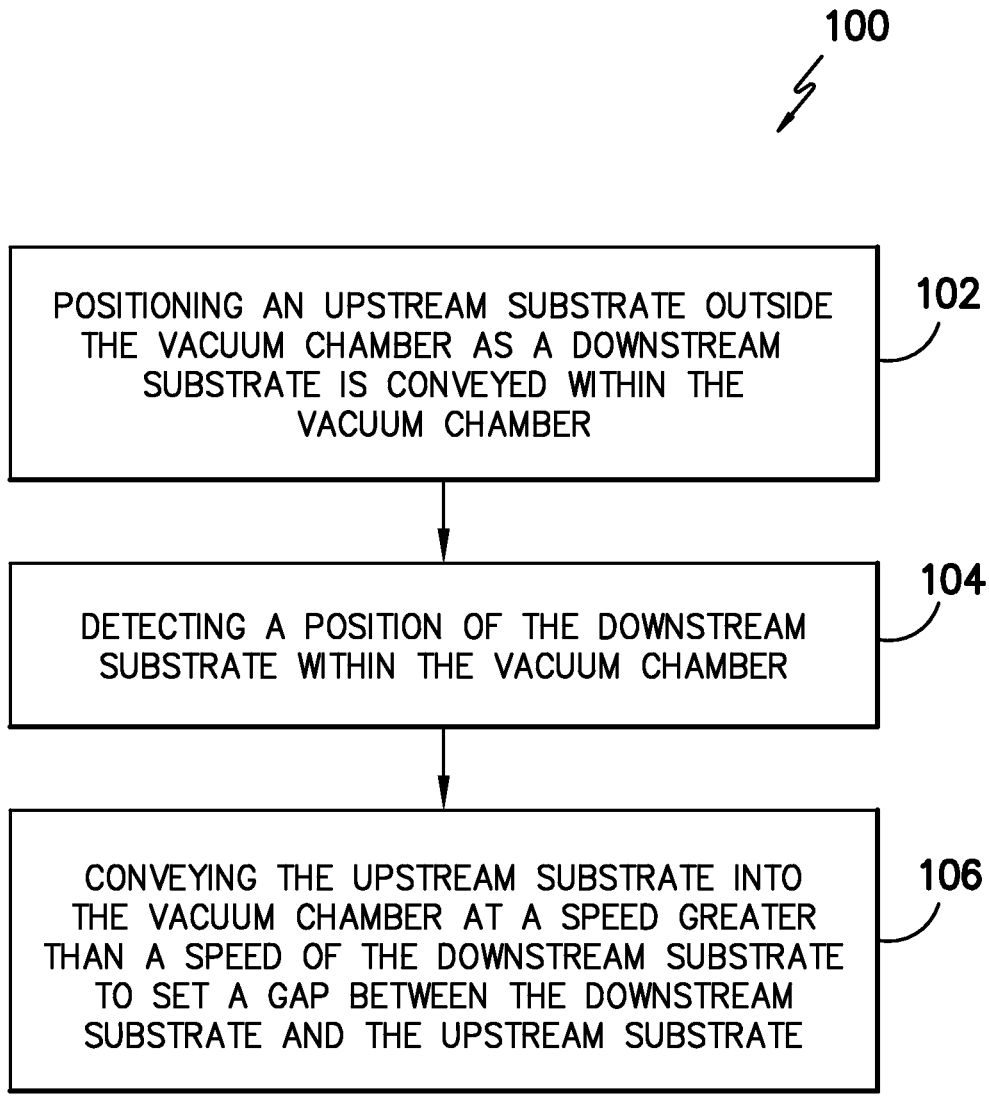
FIG. -3-

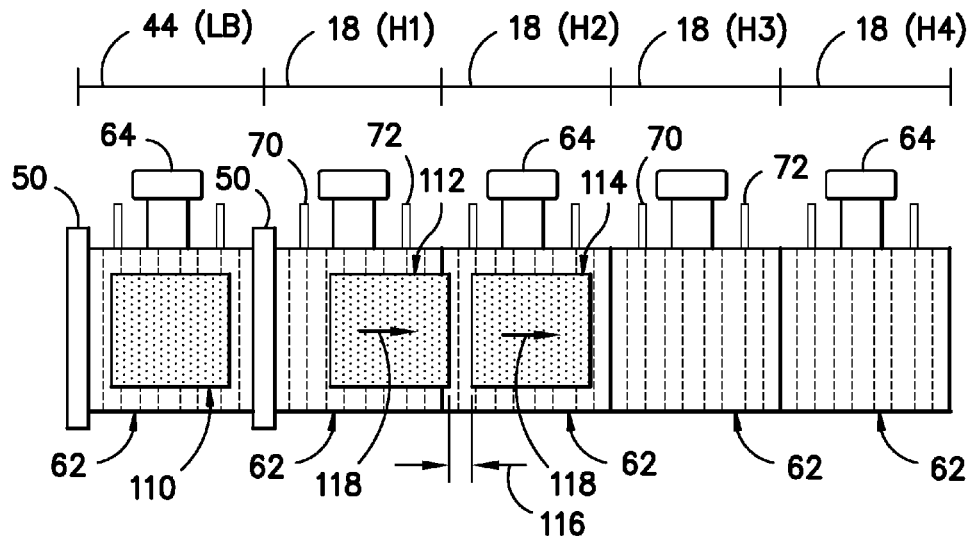
FIG. -4-
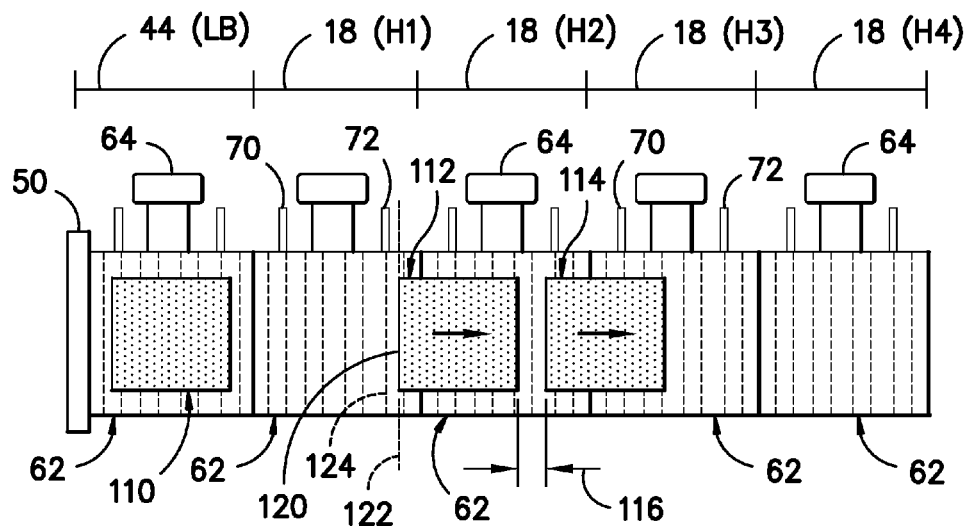
FIG. -5-

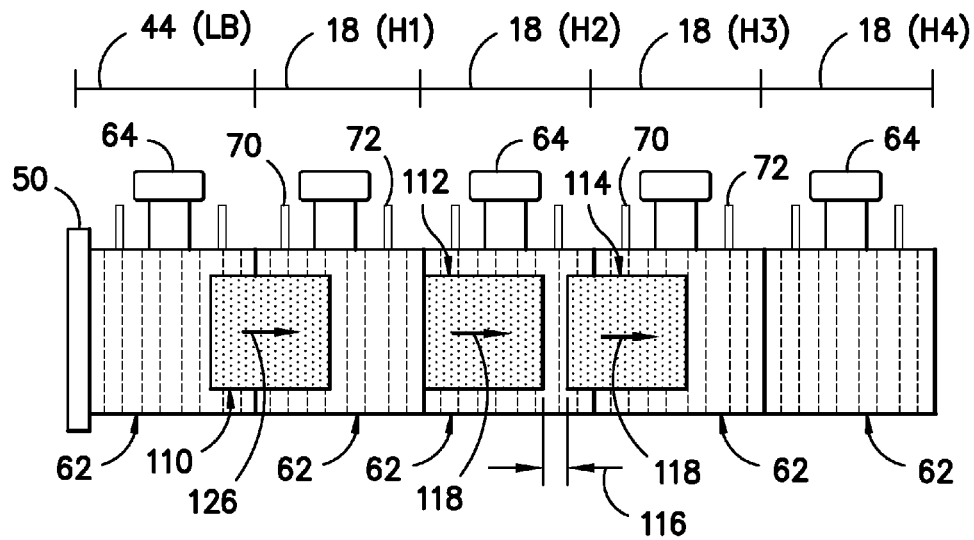
FIG. —6—
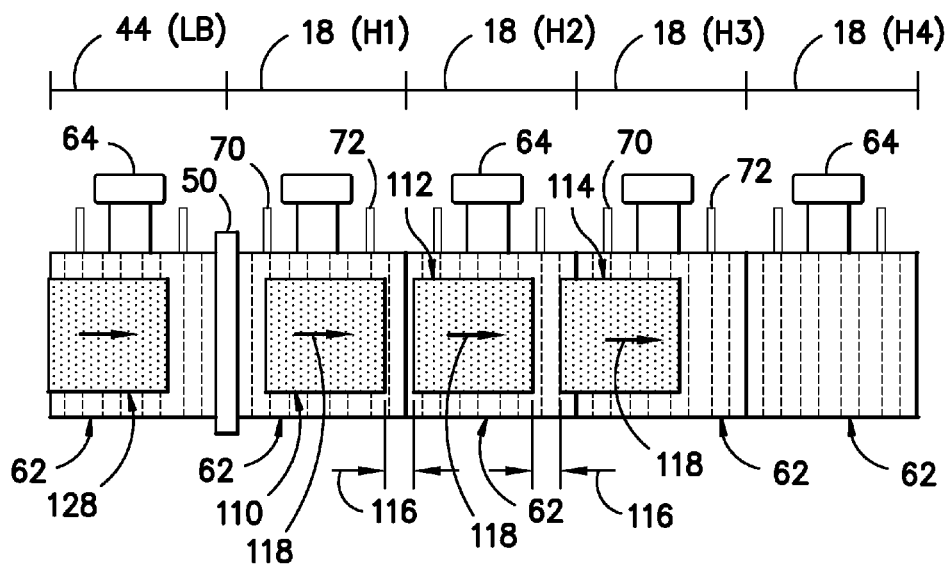
FIG. —7—

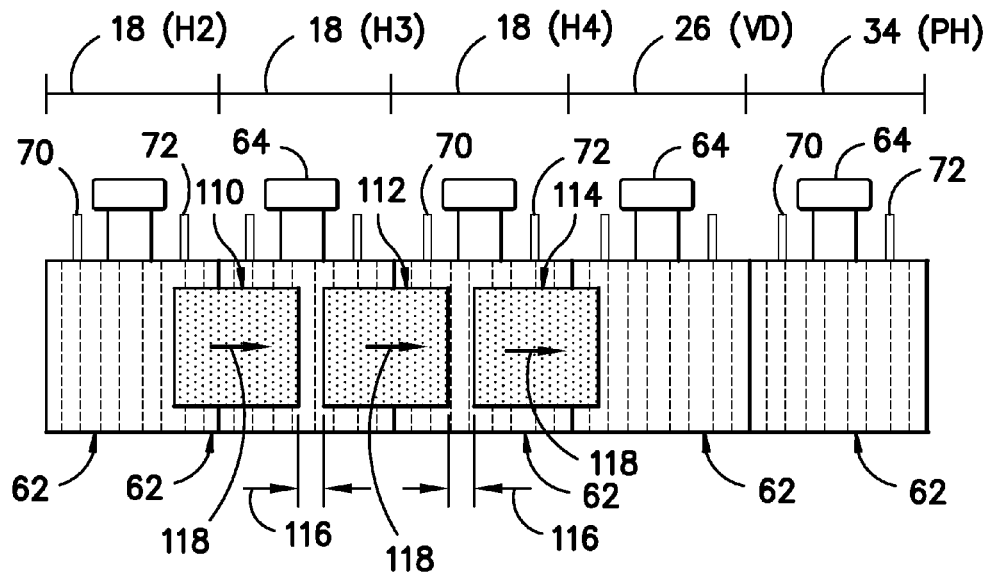
FIG. -8-
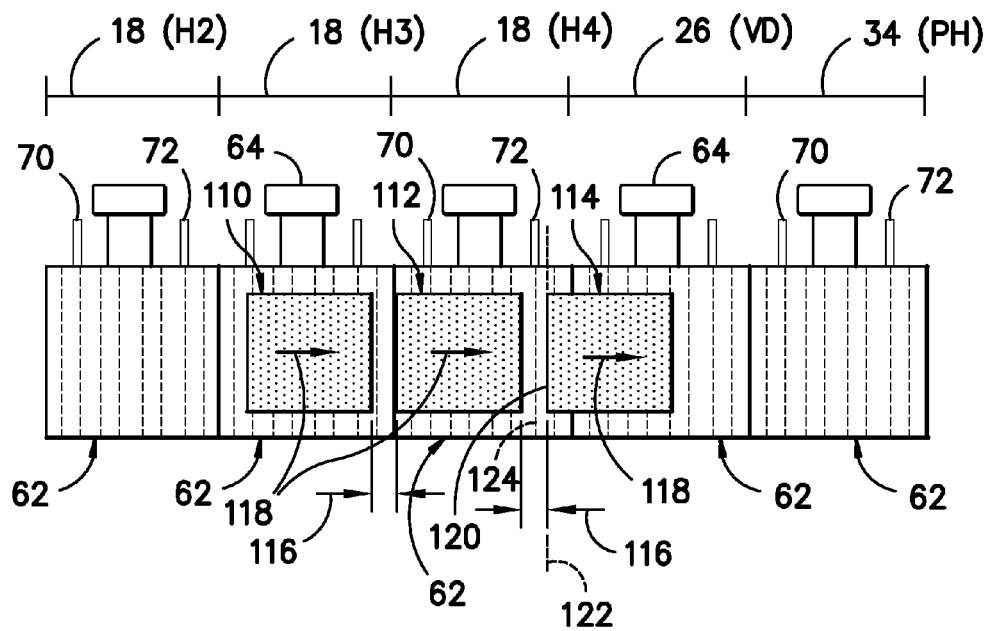
FIG. -9-

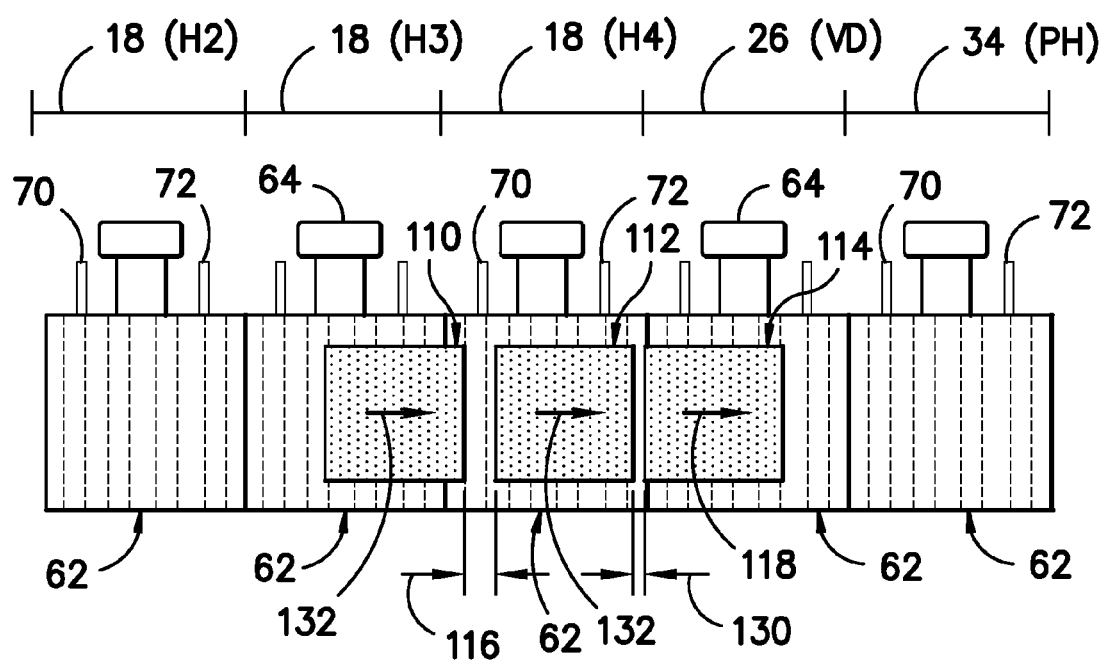
FIG. -10-

SYSTEM AND METHOD FOR GAPPING CONVEYED SUBSTRATES

FIELD OF THE INVENTION

The present subject matter relates generally to gapping substrates conveyed along a plurality of conveyors and, more particularly, to a system and method for gaping substrates linearly conveyed through a vacuum chamber, such as a vacuum deposition chamber.

BACKGROUND OF THE INVENTION

Various manufacturing processes require that substrates be linearly conveyed along a plurality of conveyors. An example of such a process is the production of thin film photovoltaic (PV) modules ("panels"), wherein individual glass substrates are linearly conveyed through a vacuum deposition chamber. Conventional vacuum deposition chambers are divided into multiple sections, such as a heating section (wherein the glass substrates are heated to a desired temperature), a vapor deposition section (wherein a thin film layer of a photo-reactive material is deposited onto the surface of the pre-heated glass substrates) and a cooling section (wherein the glass substrates are cooled). Typically, each section includes one or more individually controlled conveyors for conveying the substrates through the section. In addition, one or more conveyors may also be disposed upstream and downstream of the vacuum deposition chamber for moving the substrates through one or more vacuum lock stations.

Typically, substrates moving through a vacuum deposition chamber must be conveyed at a constant speed through the vapor deposition section to ensure that a uniform layer of material has been deposited onto the substrates. However, due to the vacuum locks positioned upstream of the vacuum chamber, conveying a new substrate into the vacuum deposition chamber involves a series of start/stop moves. This series start/stop moves creates a large gap between the new substrate and downstream substrates within the vacuum disposition chamber. Such a large gap reduces ration of the amount of material deposited onto the substrates to the amount of material deposited onto the conveyor (i.e., between the substrates), which decreases the overall efficiency of the process.

Accordingly, a system and method for gapping conveyed substrates that allows the gap between adjacent substrates to be minimized would be welcomed in the technology.

BRIEF DESCRIPTION OF THE INVENTION

Aspects and advantages of the invention will be set forth in part in the following description, or may be obvious from the description, or may be learned through practice of the invention.

In one aspect, the present subject matter is directed to a method for gapping substrates conveyed through a vacuum chamber. The method may include positioning an upstream substrate outside the vacuum chamber as a downstream substrate is conveyed within the vacuum chamber, detecting a position of the downstream substrate within the vacuum chamber and conveying the upstream substrate into the vacuum chamber at a conveyance rate greater than a conveyance rate of the downstream substrate to set a gap between the downstream substrate and the upstream substrate.

In another aspect, the present subject matter is directed to a method for gapping substrates conveyed through a vacuum chamber. The method may generally include conveying an upstream substrate and a downstream substrate through a vacuum chamber, wherein the upstream substrate is spaced apart from the downstream substrate by a gap and accelerating the upstream substrate relative to the downstream substrate to reduce the gap between the upstream and downstream substrates.

In a further aspect, the present subject matter is directed to a system for gapping substrates conveyed through a vacuum chamber, wherein the substrates include an upstream substrate initially positioned outside the vacuum chamber and a downstream substrate positioned within the vacuum chamber. The system may include a conveyor system configured to convey the upstream substrate and the downstream substrate through the vacuum chamber and a sensor configured to detect a position of the downstream substrate. In addition, the system may include a controller communicatively coupled to conveyor system and the sensor. The controller may be configured to receive a signal associated with the position of the downstream substrate within the vacuum chamber. The controller may also be configured to control the operation of the conveyor system such that the upstream substrate is conveyed into the vacuum chamber at a conveyance rate that is greater than a conveyance rate of the downstream substrate in order to set a gap between the downstream substrate and the upstream substrate.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 1 illustrates a front, plan view of one embodiment of a system for depositing materials on substrates conveyed through a vacuum chamber;

FIG. 2 illustrates a simplified top view of the system shown in FIG. 1;

FIG. 3 illustrates a flow diagram of one embodiment of a method for gapping substrates conveyed through a vacuum chamber;

FIGS. 4-7 illustrate an upstream portion of the system shown in FIG. 2 extending between the lock buffer module of the entry vacuum lock station and the last heater module of the heating section of the vacuum chamber, particularly illustrating one embodiment of how substrates may be gapped when entering the vacuum chamber; and FIGS. 8-10 illustrate a middle portion of the system shown in FIG. 2 extending between the second heater module of the heating section of the vacuum chamber and the post-heat module of the post-heating section of the vacuum chamber, particularly illustrating one embodiment of how substrates may be gapped prior to entering the vapor deposition section of the vacuum chamber.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In general, the present subject matter is directed to a system and method for spacing or gapping substrates conveyed through a vacuum chamber. Specifically, in several embodiments, substrates entering the vacuum chamber may be conveyed at a higher conveyance rate than the conveyance rate of downstream substrates, thereby setting an initial gap between adjacent substrates. Additionally, in one embodiment, the initial gap may be reduced prior to the substrates entering a vapor deposition section of the vacuum chamber, thereby reducing the amount of material that is deposited between adjacent substrates and increasing the overall efficiency of the system.

Referring now to the drawings, FIGS. 1 and 2 illustrate one embodiment of a system 10 configured for the deposition of a thin film layer on a photovoltaic (PV) module substrate 12 (referred to hereafter as a "substrate"). In particular, FIG. 1 illustrates a side, plan view of the system 10 and FIG. 2 illustrates a simplified, top view of the system 10. It should be appreciated that the thin film may be, for example, a film layer of cadmium telluride (CdTe).

As shown, the system 10 may include a vacuum chamber 14 defined by a plurality of interconnected modules. Any combination of rough and fine vacuum pumps 16 may be configured with the modules to draw and maintain a vacuum within the chamber 14. In several embodiments, the vacuum chamber 14 may include one or more heater modules 16 (e.g., heater modules H1, H2, H3 and H4 in FIG. 2) that define a heating section 18 of the vacuum chamber 14 through which the substrates 12 are conveyed and heated to a desired temperature before being conveyed into a vapor deposition section 24 of the vacuum chamber 14. Each of the heater modules 18 may include a plurality of independently controlled heaters 22, with the heaters 22 defining a plurality of different heat zones. A particular heat zone may include more than one heater 22.

The vapor deposition section 24 of the vacuum chamber 14 may generally include one or more vapor deposition modules 26 (e.g., vapor deposition module VD in FIG. 2) configured to deposit a thin film layer of a photo-reactive material (e.g., cadmium telluride (CdTe)) onto the surface of the substrates 12. For example, the vapor deposition module 26 may be configured to both receive the deposition material and distribute such material evenly across the surface of the substrates 12.

The vacuum chamber 14 may also include a plurality of interconnected cool-down modules 28 (e.g., cool-down modules C1, C2 and C3 in FIG. 2) downstream of the vapor deposition section 24. The cool-down modules 28 may define a cooling section 30 within the vacuum chamber 14 through which the substrates 12 having the thin film of sublimated source material deposited thereon are conveyed and cooled at a controlled cool-down rate prior to the substrates 12 being removed from the system 10. Each of the cool-down modules 28 may include a forced cooling system wherein a cooling medium, such as chilled water, refrigerant, gas, or other medium, is pumped through cooling coils (not illustrated) configured with the modules 28.

In the illustrated embodiment, the system 10 also includes a post-heating section 32 including one or more post-heat modules 34 (e.g., post-heat module PH in FIG. 2) located immediately downstream of the vapor deposition section 24 and upstream of the cooling section 30 in a conveyance direction of the substrates 12. The post-heat module(s) 34 may maintain a controlled heating profile of each substrate 12 until the entire substrate 12 is moved out of the vapor deposition section 24 to prevent damage to the substrate 12, such as warping or breaking caused by uncontrolled or drastic thermal stresses. If the leading section of the substrate 12 were allowed to cool at an excessive rate as it exited the vapor deposition section 24, a potentially damaging temperature gradient would be generated longitudinally along the substrate 12. This condition could result in breaking, cracking, or warping of the substrate from thermal stress.

Additionally, as shown in FIG. 1, a feed device 36 may be configured with the vapor deposition module(s) 26 to supply source material, such as granular CdTe, to the module(s) 26. The feed device 36 may take on various configurations within the scope and spirit of the invention, and functions to supply the source material without interrupting the continuous vapor deposition process within the vapor deposition section 24 or conveyance of the substrates 12 through the deposition section 24.

Still referring to FIG. 1, the individual substrates 12 may be initially placed onto a load conveyor 38 (e.g., load conveyor LC in FIG. 2), and may be subsequently moved into an entry vacuum lock station that includes, for example, a load lock or load module 42 (e.g., load module LM in FIG. 2) and a buffer module 44 (e.g., buffer module LB in FIG. 2). A "rough" (i.e., initial) vacuum pump 46 may be configured with the load module 42 to draw an initial vacuum, and a "fine" (i.e., final) vacuum pump 48 may be configured with the buffer module 44 to increase the vacuum in the buffer module 44 to essentially the vacuum pressure within the vacuum chamber 14. Locks or valves 50 (e.g., gate-type slit valves or rotary-type flapper valves) may be operably disposed between the load conveyor 38 and the load module 42, between the load module 42 and the buffer module 44, and between the buffer module 44 and the vacuum chamber 14. These valves 50 may be sequentially actuated by a motor or other type of actuating mechanism 52 in order to introduce the substrates 12 into the vacuum chamber 14 in a step-wise manner without affecting the vacuum within the chamber 14.

During operation of the system 10, an operational vacuum may be maintained in the vacuum chamber 14 by way of any combination of rough and/or fine vacuum pumps 16. When introducing a substrate 12 into the vacuum chamber 14, the valves 50 between the load conveyor 38 and the load module 42 and between the load module 42 and the buffer module 44 may be initially closed, with the load buffer 44 being at a base vacuum (i.e., a vacuum setpoint below the process vacuum within the vacuum chamber 14) and the load module 42 being at a rough vacuum (i.e., a vacuum setpoint below the process vacuum). The load module 42 may then be vented to atmosphere. The valve 50 between the load conveyor 38 and the load module 42 may then be opened and a substrate 12 may be moved into the load module 42. At this point, the first valve 50 may be shut and the rough vacuum pump 46 may then draw an initial rough vacuum (e.g., to a cross-over pressure) in the load module 42. The valve 50 between the load module 42 and the buffer module 44 may then be opened and the substrate 12 may be conveyed into the buffer module 44. Subsequently, the valve 50 between the load module 42 and buffer module 44 may be closed and the fine vacuum pump 48 may then increase the vacuum in the buffer module 44 to approximately the same vacuum in the vacuum chamber 14. At this point, the valve 50 between the buffer module 44 and vacuum chamber 14 may be opened and the substrate 12 may be conveyed into the first heater module 18. It should be appreciated that, while the vacuum is being increased in the buffer module 44, the load module 42 may be vented again and a new substrate 12 may be conveyed into the load module 32.

An exit vacuum lock station 54 may be configured downstream of the last cool-down module 28 (e.g., cool-down module C3 in FIG. 2), and may operate essentially in reverse of the entry vacuum lock station 40 described above. For example, the exit vacuum lock station 54 may include an exit buffer module 56 (e.g., exit buffer module XB in FIG. 2) and a downstream exit lock module 58 (e.g., exit lock module XL in FIG. 2). Sequentially operated valves 50 may be disposed between the buffer module 56 and the last cool-down modules 28, between the buffer module 56 and the exit lock module 58, and between the exit lock module 58 and an exit conveyor 60 (e.g., exit conveyor XC in FIG. 2). A fine vacuum pump 58 may be configured with the exit buffer module 56, and a rough vacuum pump 46 may be configured with the exit lock module 58. The pumps 46, 48 and valves 50 may be sequentially operated to move the substrates 12 out of the vacuum chamber 14 in a step-wise fashion without loss of vacuum condition within the vacuum chamber 14.

The system 10 may also include a conveyor system configured to move the substrates 12 into, through, and out of the vacuum chamber 14. In several embodiments, each module may include a separate conveyor 62, with each conveyor 62 being individually controlled. For example, as particularly shown in FIG. 2, each conveyor 62 may be coupled to a separate drive motor 64 (e.g., a servo motor) such that the conveyance rate of the substrates 12 through each module may be individually controlled. It should be appreciated that the conveyors 62 may generally comprise any suitable conveyors known in the art. For instance, in the illustrated embodiment, the conveyors 62 are configured as roller conveyors having rotatably driven rollers. However, in other embodiments, the conveyors 62 may be belt conveyors, chain conveyors and/or the like.

To provide independent control of each of the various modules and respective conveyors 62 in the system 10, each module may include an independent sub-controller 66 configured therewith to control the individual functions of the respective module (e.g., by controlling the conveyance rate of the module's conveyor 62). The plurality of sub-controllers 66 may, in turn, be in communication with a central system controller 68, as shown in FIG. 1. The central system controller 68 may be configured to monitor and control (via the independent sub-controllers 66) the functions of any one of the modules so as to achieve an overall desired heat-up rate, deposition rate, cool-down rate, conveyance rate, and so forth, in processing of the substrates 12 through the system 10.

It should be appreciated that, as described herein, the term "controller" may be used to describe one or more of the sub-controllers 66, the system controller 68 and/or any suitable combination of sub-controllers 66 in communication with the system controller 68.

Referring still to FIGS. 1 and 2, for independent control of the individual respective conveyors 62, each of the modules may also include any manner of active or passive sensors 70, 72 (e.g., proximity sensors) configured to detect the presence of the substrates 12 as they are conveyed through the module. For instance, as particularly shown in FIG. 2, each module may include a first sensor 70 configured to detect the presence of a substrate 12 as it enters the module and a second sensor 72 configured to detect the presence of a substrate 12 as it exits the module. The sensors 70, 72 may be in communication with the respective sub-controller 66, which may, in turn, be in communication with the system controller 68. In this manner, the individual conveyors 62 may be controlled, as will be described below, to ensure that proper spacing between the substrates 12 is maintained and that the substrates 12 are conveyed at the desired conveyance rate through the vacuum chamber 14.

As indicated above, the present subject matter is directed to both a system and method for gapping substrates 12 conveyed through a vacuum chamber 14. Thus, one embodiment of a method for gapping substrates 12 will generally be described with reference to FIG. 3 and will be explained in greater detail with reference to FIGS. 4-7. It should be appreciated that FIGS. 4-7 illustrate an upstream portion of the system 10 shown in FIG. 2 extending between the buffer module 44 (LB) of the vacuum lock station 40 and the last heater module 18 (H4) of the heating section 20.

Thus, referring to FIG. 3, one embodiment of a method 100 for gapping substrates 12 being conveyed through a vacuum chamber 14 is illustrated. As shown, the method 100 may generally include positioning an upstream substrate outside the vacuum chamber as a downstream substrate is conveyed within the vacuum chamber 102, detecting a position of the downstream substrate within the vacuum chamber 104, conveying the upstream substrate into the vacuum chamber at a speed greater than a speed of the downstream substrate to set a gap between the downstream substrate and the upstream substrate 106.

As shown in FIG. 3, in 102, an upstream substrate is positioned outside the vacuum chamber as a downstream substrate is conveyed within the vacuum chamber. For example, as shown in FIG. 4, in several embodiments, an upstream substrate 110 may be positioned within a portion of the entry vacuum lock station 40 (e.g., the buffer module 44 (LB)) prior to entering the vacuum chamber 14. Additionally, while the upstream substrate 110 is maintained within the buffer module 44 (LB) as the pressure within the module is adjusted, one or more downstream substrates (e.g., a first downstream substrate 112 and a second downstream substrate 114) may be conveyed at a given speed within the vacuum chamber 14, thereby creating a large gap between the upstream substrate 110 and the first downstream substrate 112.

It should be appreciated that, for purposes of this description, it has been assumed that a desired gap 116 has already been set between the first and second downstream substrates 112, 114 using the method 100 described herein. As such, the first and second downstream substrates 110, 112 may be conveyed within the vacuum deposition chamber at a constant speed or conveyance rate 118 in order to maintain the desired gap 116.

Additionally, in 104, the position of the downstream substrate(s) 112, 114 within the vacuum chamber 14 may be detected. Specifically, in several embodiments, it may be desirable to detect when the substrate closest to the upstream substrate 110 (i.e., the first downstream substrate 122) transitions from the first conveyor within the vacuum chamber 14 (e.g., the conveyor 62 associated with the first heater module 18 (H1)) to the second conveyor within the vacuum chamber 14 (e.g., the conveyor 62 associated with the second heater module 18 (H2)). For instance, as shown in FIG. 5, the first downstream substrate 112 may transition from the conveyor 62 associated with the first heater module 18 (H1) to the conveyor 62 associated with the second heater module 18 (H2) when a trailing edge 120 of the first downstream substrate 112 is aligned with and/or moves past a top-dead-center position 122 of the last roller 124 of the conveyor 62 associated with the first heater module 18 (H1). At such point, the conveyance rate of the first downstream substrate 122 may be controlled solely by the conveyor 62 associated with the second heater module 18 (H2).

As indicated above, several embodiments, the sensors 70, 72 associated with each module may be configured to detect when a substrate 12 enters and exits the module. For example, as shown in FIG. 5, the second sensor 72 of the first heater module 18 (H1) may be configured to detect the position of the trailing edge 120 of the first downstream substrate 112 as the substrate exits the first heater module 18 (H1). Utilizing this detected position, the controller may then be configured to determine when the trailing edge 120 of the first downstream substrate 112 is aligned with and/or moves past the top-dead-center position 122. For instance, in one embodiment, the second sensor 72 may be positioned directly at the top-dead-center position 122 such that the signals received from the second sensor 72 directly correlate to the trailing edge 120 of the first downstream substrate 112 being positioned at the top-dead-center position 122. Alternatively, as shown in FIG. 5, the second sensor 72 may be positioned upstream of the top-dead-center position 122. In such an embodiment, the controller may be configured to determine when the trailing edge 120 of the first downstream substrate 112 is aligned with and/or moves past the top-dead-center position 122 based on the conveyance rate of the first downstream substrate 112 and the distance between the second sensor 72 and the top-dead-center position 122.

It should be appreciated that the detection of the first downstream substrate 112 transitioning from the first conveyor to the second conveyor of the vacuum chamber 14 may also be utilized as a trigger for opening the lock or valve 50 of the vacuum lock station 40. For example, as shown in FIG. 5, when the trailing edge 120 of the first downstream substrate 112 is aligned with and/or moves past the top-dead-center position 122, the valve (not shown) separating the buffer module 44 (LB) from the first heater module 18 (H1) may be opened, thereby allowing the upstream substrate 110 to be conveyed into the vacuum chamber 14.

Referring back to FIG. 3, in 106, the upstream substrate is conveyed into the vacuum chamber at a conveyance rate greater than the conveyance rate of the downstream substrate in order to set the gap between the downstream and upstream substrates. For example, as shown in FIG. 6, the speed of the conveyors 62 for the buffer module 44 (LB) and the first heater module 18 (H1) may be set to a higher speed than the speed of the downstream conveyors (e.g., the conveyors 62 for the downstream heater modules 18 (H2, H3 and H4), thereby moving the upstream substrate 110 into the vacuum chamber 14 at a higher conveyance rate 126 than the conveyance rate 118 of the downstream substrates 112, 114. Thus, the upstream substrate 110 may catch-up to the downstream substrates 122, 114, thereby setting the desired gap 116 between the upstream substrate 110 and the first downstream substrate 112. For instance, as shown in FIG. 7, when the upstream substrate 110 catches up to the first downstream substrate 112, the gap 116 defined between the upstream substrate 110 and the first downstream substrate 112 may be the same as the gap 116 defined between the first downstream substrate 112 and the second downstream substrate 114.

It should be appreciated that the particular speed (i.e., the conveyance rate 122 of the upstream substrate 110) at which the conveyors 62 for the buffer module 44 (LB) and the first heater module 18 (H1) need to be operated in order to permit the upstream substrate 110 to catch-up to the downstream substrates 112, 114 may generally be determined using known relationships between distance, speed (and/or acceleration) and time. For instance, information including but, not limited to, the distance between the upstream substrate 110 and the first downstream substrate 112 when the trailing edge 120 of the first downstream substrate 112 is aligned with and/or moves past the top-dead-center position 122, the distance corresponding to the desired gap 116, the conveyance speed 118 of the first downstream substrate 112, the maximum conveyance speed 126 of the upstream substrate 110 during the catch-up period and/or the like, may be utilized by the controller to control the operation of the conveyors 62 for the buffer module 44 (LB) and the first heater module 18 (H1). In particular, such information may permit the controller to determine operating parameters including, but not limited to, the time and distance required to accelerate the upstream substrate 110 to its maximum conveyance speed 126, the time and distance required to decelerate the upstream substrate 110 to the conveyance speed 118 of the first downstream substrate 112, the time the upstream substrate 110 is at its maximum conveyance speed 126, the total time required to the set the gap 116 between the upstream substrate 110 and the first downstream substrate 112 and the total distance the first downstream substrate 112 has moved while the upstream substrate 110 is being conveyed at the higher conveyance rate 126.

Additionally, it should be appreciated that, once the upstream substrate 110 has fully entered the vacuum chamber 14, a new substrate 128 may be positioned immediately upstream of the chamber 14 (e.g., by positioning the new substrate 128 within the buffer module 44 (LB). For example, as shown in FIG. 7, the lock or valve 50 between the buffer module 44 (LB) and the first heater module 18 (H1) has been closed so that a new substrate 128 may be conveyed into the buffer module 44 (LB). Thereafter, the method described above with reference to FIGS. 3-7 may be repeated. For instance, the new substrate 128 may be maintained within the buffer module 44 (LB) until a trailing edge of the upstream substrate 110 is aligned with and/or moves past the top-dead-center position 122 of the last roller 124 of the first heater module 18 (H1). The valve 50 between the buffer module 44 (LB) and the first heater module 18 (H1) may then be opened to permit the new substrate 128 to be conveyed into the vacuum chamber 14 at an increased conveyance rate in order to set the gap between the new substrate 128 and the upstream substrate 110.

Moreover, it should also be appreciated that, in several embodiments, the gap 116 set between the substrates 12 entering the vacuum chamber 14 may be decreased as the substrates 12 move from the heating section 20 to the vapor deposition section 24 of the vacuum chamber 14. Specifically, in several embodiments, the substrates may be accelerated as a downstream substrate transitions into the vapor deposition section 24, thereby reducing the gap 116 (hereinafter referred to as the "initial gap 116") and setting a final gap 130 (FIG. 10) between the substrates 12. For example, FIGS. 8-10 illustrate one embodiment of how a final gap may be set between a pair of adjacent substrates 12 as the downstream substrate transitions into the vapor deposition section 24 of the vacuum chamber 14. It should be appreciated that FIGS. 8-10 illustrate a middle portion of the system 10 shown in FIG. 2 extending between the second heater module 18 (H2) of the heating section 20 to the post-heat module 34 of the post-heating section 32.

As shown in FIG. 8, the substrates being conveyed through the vacuum chamber 14 (e.g., the upstream substrate 110, first downstream substrate 112 and second downstream substrate 112 described above) have been previously gapped according the method described above with reference to FIGS. 3-8. Thus, an initial gap 116 has been set between each pair of adjacent substrates. In addition, the substrates are being conveyed through the vacuum chamber 114 at the same conveyance rate 118. However, as shown in FIG. 8, the second downstream substrate 114 has reached the vapor deposition section 24 of the vacuum chamber 14 (e.g., vapor deposition module 26 (VD)). Accordingly, it may be desirable to decrease the initial gap 116 between the second downstream substrate 114 and the first downstream substrate 112 in to reduce the amount of material deposited between such substrates.

In several embodiments, the initial gap 116 may be reduced by utilizing a method similar to the method described above with reference to FIGS. 3-7. For example, in the illustrated embodiment, the controller may be configured to detect when the second downstream substrate 114 transitions from the conveyor immediately upstream of the vapor deposition section 24 (e.g., the conveyor 62 associated with the last heater module 18 (H4)) to a conveyor within the vapor deposition section 24 (e.g., the conveyor 62 associated with the vapor deposition module 26 (VD)). For instance, as shown in FIG. 9, the controller may be configured to detect such transition by detecting when a trailing edge 120 of the second downstream substrate 114 is aligned with and/or moves past a top-dead-center position 122 of the last roller 124 of the conveyor 62 associated with the last heater module 18 (H4) (e.g., by using signals received from the second sensor 72 of the last heater module 18 (H4). At such point, the conveyance rate of the second downstream substrate 114 may be controlled solely by the conveyor 62 associated with the vapor deposition module 26 (VD).

Thereafter, the speed of the conveyers upstream of the vapor deposition section 24 may be increased in order to accelerate any upstream substrates relative to the substrate moving through the deposition section 24. For example, as shown in FIG. 10, the speed of the conveyors 62 associated with the third and fourth heater modules 18 (H3 and H4) may be increased such that the upstream substrate 110 and the first downstream substrate 112 are accelerated relative to the second downstream substrate 114. In other words, the upstream substrate 110 and the first downstream substrate 112 may be temporarily conveyed at higher conveyance rate 132 than the second downstream substrate 114, thereby setting a final gap 130 between the first downstream substrate 112 and the second downstream substrate 114.

Additionally, the initial gap 116 may be maintained between the upstream substrate 110 and the first downstream substrate 112 as the final gap 130 is being set between the first downstream substrate 112 and the second downstream substrate 114. Thus, it should be appreciated that the above described gapping process may be continuously repeated in order to set the final gap 130 between the substrate entering the vapor deposition section 24 of the vacuum chamber 14 and the substrate immediately upstream of deposition section 24. For instance, referring to FIG. 9, when the trailing edge 120 of the first downstream substrate 112 is aligned with and/or moves past a top-dead-center position of the last roller of the conveyor 62 associated with the last heater module 18 (H4), the upstream substrate 110 may be accelerated relative to the first downstream substrate 112 so as to set the final gap 130 between the first downstream substrate 112 and the upstream substrate 110.

It should be appreciated that, in alternative embodiments, the final gap 130 need not be set immediately prior to a substrate 12 entering the vapor deposition section 24 of the vacuum chamber 14, but may generally be set at any suitable location upstream of the vapor deposition section 24. It should also be appreciated that various other gaps may be set in addition to the initial and final gaps 116, 130. For instance, in one embodiment, the initial gap 116 may be set when a substrate 12 enters the vacuum chamber, the final gap 130 may be set prior to the substrate 12 entering the vapor deposition section 24 and an intermediate gap may be set at a point between the locations for setting the initial and final gaps 116, 130. In another embodiment, the initial gap 116 may be continuously reduced as the substrates 12 are conveyed towards the vapor deposition section 24 of the vacuum chamber 14.

Additionally, it should be appreciated that, although the present subject matter has been primarily described with reference to conveying glass substrates through a vacuum chamber, the gapping methods disclosed herein may also be utilized to gap any other suitable articles that may be conveyed along a conveyor system. Thus, in one embodiment, the present subject matter discloses a method for gapping articles conveyed along a conveyor system. The method may include positioning an upstream article on a first conveyor of the conveyor system, positioning a downstream article on a second conveyor of the conveyor system (wherein the first conveyor is positioned upstream of the second conveyor), conveying the downstream article from the second conveyor to a third conveyor of the conveyor system (wherein the second conveyor is positioned upstream of the third conveyor), operating the first and second conveyors at a speed that is greater than a speed of the third conveyor when the downstream article transitions from the second conveyor to the third conveyor and conveying the upstream article along the first and second conveyors at the greater speed in order to set a gap between the downstream substrate and the upstream substrate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for gapping substrates conveyed through a vacuum chamber, the method comprising:
   positioning an upstream substrate outside the vacuum chamber as a downstream substrate is conveyed within the vacuum chamber;
   detecting a position of the downstream substrate within the vacuum chamber;
   conveying the upstream substrate into the vacuum chamber at a conveyance rate greater than a conveyance rate of the downstream substrate to set a gap between the downstream substrate and the upstream substrate,
   wherein detecting a position of the downstream substrate within the vacuum chamber comprises detecting when the downstream substrate transitions from a first conveyor to a second conveyor of the vacuum chamber, and
   wherein detecting when the downstream substrate transitions from a first conveyor to a second conveyor of the vacuum chamber comprises detecting when the downstream substrate moves past a top-dead-center position of the first conveyor.

2. The method of claim 1, wherein positioning an upstream substrate outside the vacuum chamber as a downstream substrate is conveyed within the vacuum chamber comprises positioning the upstream substrate within a vacuum lock station upstream of the vacuum chamber.

3. The method of claim 2, wherein conveying the upstream substrate into the vacuum chamber at a conveyance rate greater than a conveyance rate of the downstream substrate to set a gap between the downstream substrate and the upstream substrate comprises conveying the upstream substrate from the vacuum lock station into the vacuum chamber at a conveyance rate greater than a conveyance rate of the downstream substrate.

4. The method of claim 1, wherein conveying the upstream substrate into the vacuum chamber at a conveyance rate greater than a conveyance rate of the downstream substrate to set a gap between the downstream substrate and the upstream substrate comprises:
   conveying the upstream substrate along the first conveyor at a first conveyance rate; and
   conveying the downstream substrate along the second conveyor at a second conveyance rate, the first conveyance rate being greater than the second conveyance rate.

5. The method of claim 1, wherein at least one of the first conveyor or the second conveyor comprises a conveyor of a heating section of the vacuum chamber.

6. The method of claim 1, wherein the gap comprises an initial gap, further comprising:
   conveying the downstream substrate into a vapor deposition section of the vacuum chamber; and
   accelerating the upstream substrate relative to the downstream substrate as the downstream substrate enters the vapor deposition section to set a final gap between the downstream substrate and the upstream substrate.

7. The method of claim 6, wherein conveying the downstream substrate into a vapor deposition section of the vacuum chamber comprises conveying the downstream substrate from a first conveyor upstream of the vapor deposition section to a second conveyer within the vapor deposition section.

8. The method of claim 7, wherein accelerating the upstream substrate relative to the downstream substrate as the downstream substrate enters the vapor deposition section to set a final gap between the downstream substrate and the upstream substrate comprises:
   conveying the upstream substrate along the first conveyor at a first conveyance rate; and
   conveying the downstream substrate along the second conveyor at a second conveyance rate, the first conveyance rate being greater than the second conveyance rate.

9. The method of claim 1, further comprising, after the gap has been set between the upstream and downstream substrates, accelerating the upstream substrate relative to the downstream substrate to reduce the gap between the upstream and downstream substrates.

10. A system for gapping substrates conveyed through a vacuum chamber, the substrates including an upstream substrate initially positioned outside the vacuum chamber and a downstream substrate positioned within the vacuum chamber, the system comprising:
   a conveyor system configured to convey the upstream substrate and the downstream substrate through the vacuum chamber;
   a sensor configured to detect a position of the downstream substrate; and
   a controller communicatively coupled to conveyor system and the sensor, the controller being configured to receive a signal associated with the position of the downstream substrate within the vacuum chamber, the controller being further configured to control the operation of the conveyor system such that the upstream substrate is conveyed into the vacuum chamber at a conveyance rate that is greater than a conveyance rate of the downstream substrate in order to set a gap between the downstream substrate and the upstream substrate,
   wherein the conveyor system includes a first conveyor disposed outside the vacuum chamber and second and third conveyers disposed within the vacuum chamber, the upstream substrate being initially positioned on the first conveyor, the second conveyor being disposed upstream of the third conveyor.

11. The system of claim 10, wherein the first conveyor comprises a conveyor of a vacuum lock station positioned upstream of the vacuum chamber.

12. The system of claim 10, wherein at least one of the second conveyor or the third conveyor comprises a conveyor of a heating section of the vacuum chamber.

13. The system of claim 10, wherein the sensor is configured to detect when the downstream substrate transition from the second conveyer to the third conveyor.

14. The system of claim 13, wherein the controller is configured to control the operation of the conveyor system such that a speed of the first and second conveyors is greater than a speed of the third conveyor when the downstream substrate transitions from the second conveyer to the third conveyor.

15. The system of claim 10, wherein the gap comprises an initial gap and wherein the conveyor system is configured to convey the upstream substrate and the downstream substrates through a vapor deposition section of the vacuum chamber.

16. The system of claim 15, wherein the controller is configured to control the operation of conveyor system such that the upstream substrate is accelerated relative to the downstream substrate as the downstream substrate enters the vapor deposition section in order to set a final gap between the downstream substrate and the upstream substrate.

* * * * *